(12) United States Patent
Kawakami

(10) Patent No.: US 6,922,151 B2
(45) Date of Patent: Jul. 26, 2005

(54) BATTERY REMAINING AMOUNT WARNING CIRCUIT

(75) Inventor: Chikuni Kawakami, Asaka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 198 days.

(21) Appl. No.: 10/617,047

(22) Filed: Jul. 11, 2003

(65) Prior Publication Data

US 2004/0008117 A1 Jan. 15, 2004

(30) Foreign Application Priority Data

Jul. 11, 2002 (JP) .......................... 2002-202142

(51) Int. Cl.⁷ .............................................. G08B 21/00
(52) U.S. Cl. .............................. 340/636.1; 340/636.12; 340/636.19; 340/661; 320/149
(58) Field of Search ..................... 340/636.1–636.15, 340/636.19, 657–664; 320/149–152; 323/274–277

(56) References Cited

U.S. PATENT DOCUMENTS

| | | | | |
|---|---|---|---|---|
| 4,356,481 A | | 10/1982 | Kuki | |
| 5,164,652 A | * | 11/1992 | Johnson et al. | 320/106 |
| 5,237,257 A | * | 8/1993 | Johnson et al. | 320/106 |
| 5,905,364 A | * | 5/1999 | Ookita | 320/141 |
| 6,150,823 A | * | 11/2000 | Takahashi et al. | 324/427 |
| 6,232,747 B1 | * | 5/2001 | Takahashi et al. | 324/427 |
| 6,744,698 B2 | * | 6/2004 | Koyama et al. | 368/204 |

FOREIGN PATENT DOCUMENTS

| | | |
|---|---|---|
| JP | 55-136818 | 10/1980 |
| JP | 63-3538 | 1/1988 |

* cited by examiner

*Primary Examiner*—Daniel Wu
*Assistant Examiner*—Son Tang
(74) *Attorney, Agent, or Firm*—Sughrue Mion, PLLC

(57) ABSTRACT

The battery remaining amount warning circuit can issue a battery remaining amount warning after battery power is fully used, reduce current consumption, and issue a warning at appropriate timing for various types of battery. A system controller calculates DC resistance value of the battery from a difference between a current value in an operating mode before a change which is stored in the memory and a current value in an operating mode after the change which is stored in the memory and a voltage variation of the battery measured by an A/D converter, and when the calculated DC resistance value becomes greater than a predetermined value, the system controller sends a warning instruction signal to a data LCD.

2 Claims, 5 Drawing Sheets

BATTERY REMAINING AMOUNT WARNING CIRCUIT

BACKGROUND OF THE INVENTION

1. Field of the Invention

The present invention relates to a battery remaining amount warning circuit applicable to an electronic device using a battery.

2. Description of the Related Art

Today, many electronic devices use batteries. As a conventional method for warning about a remaining amount of a battery, it is a general practice that a battery voltage is measured and a warning about the remaining amount is issued when battery voltage is at a predetermined level or lower, or DC resistance of the battery increases.

There are a variety of types of battery such as alkaline cell, nickel hydrogen cell, nickel cadmium cell, and there are also a variety of battery characteristics. However, with a monitoring of the battery voltage alone, depending on the type of the battery, the battery power may not be used to the full because a considerable amount of the battery can still be used after the warning is given about the insufficient remaining amount of the battery.

Furthermore, there is also a proposal of a method for constantly measuring a battery voltage by providing a dummy-load circuit (Japanese Patent Publication No. 63-3538). However, this method increases unnecessary power consumption. Furthermore, when the remaining amount of the battery is predicted from the battery voltage, the voltage varies depending on the type of the battery and when the battery voltage is low because of the nature of the type of the battery, a warning is issued earlier. For example, a warning is issued with an alkaline cell at 1.5 V/cell and with a NiCd cell at 1.2 V/cell.

SUMMARY OF THE INVENTION

In view of the above-described circumstances, it is an object of the present invention to provide a battery remaining amount warning circuit capable of using battery power sufficiently before issuing a warning about the remaining amount of the battery and issuing a warning for a variety of types of battery with small current consumption at appropriate timing.

In order to attain the above-described object, the present invention is directed to a battery remaining amount warning circuit that detects a voltage drop of a battery in an electronic device, comprising: a storage device which stores a current value in each of a plurality of operating modes of the electronic device; a measuring device which measures a voltage variation of the battery when a first one of the operating modes of the electronic device is changed for a second one of the operating modes of the electronic device; a calculation device which calculates a DC resistance value of the battery from the voltage variation measured by the measuring device and a difference between the current value in the first operating mode stored in the storage device and the current value in the second operating mode stored in the storage device; and a warning device which gives a warning when the DC resistance value calculated by the calculation device becomes greater than a predetermined warning level.

According to the present invention, the measuring device can measure variations in the voltage value when the operating modes are changed. That is, the measuring device can measure the battery voltage before the change when the operating modes are changed, also measure the battery voltage after the change and calculate the difference, or the measuring device can directly measure a voltage drop or voltage rise when the operating modes are changed. The storage device stores current values in various operating modes, and therefore it stores the current values in the operating mode before the change and the operating mode after the change. The calculation device extracts the current value in the operating mode before the change from the storage device, also extracts the current value in the operating mode after the change, calculates the difference between the two and calculates the DC resistance of the battery from the difference in the current values and the voltage variation measured by the measuring device. The warning device gives a warning when the calculated DC resistance value becomes greater than a predetermined warning level. When the voltage drop increases when the operating modes are changed due to consumption of the battery, the internal resistance of the battery increases.

In the battery remaining amount warning circuit, the electronic device can be a digital camera and the various operating modes include a playback mode, recording mode, flash charge recording mode, etc., of the digital camera.

It is possible to detect a voltage drop of the battery of the digital camera. The various operating modes refer to a playback mode, a recording mode when an LCD (liquid crystal display) is turned OFF, a recording mode when the LCD is turned ON and a flash charge recording mode, etc. The flash charge recording mode normally has a current value greater than that in the playback mode, and therefore when the operating modes are changed, for example, from the playback mode to the flash charge recording mode, a difference current value is calculated by the calculation device from current values in both modes stored in the storage device and the measuring device measures the voltage drop value and the calculation device calculates a DC resistance value of the battery from the difference current value and voltage drop value.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

With reference now to the attached drawings, an embodiment of a battery remaining amount warning circuit according to the present invention will be explained in detail below. This embodiment will be explained as the battery remaining amount warning circuit built in a digital camera.

Figure 1:
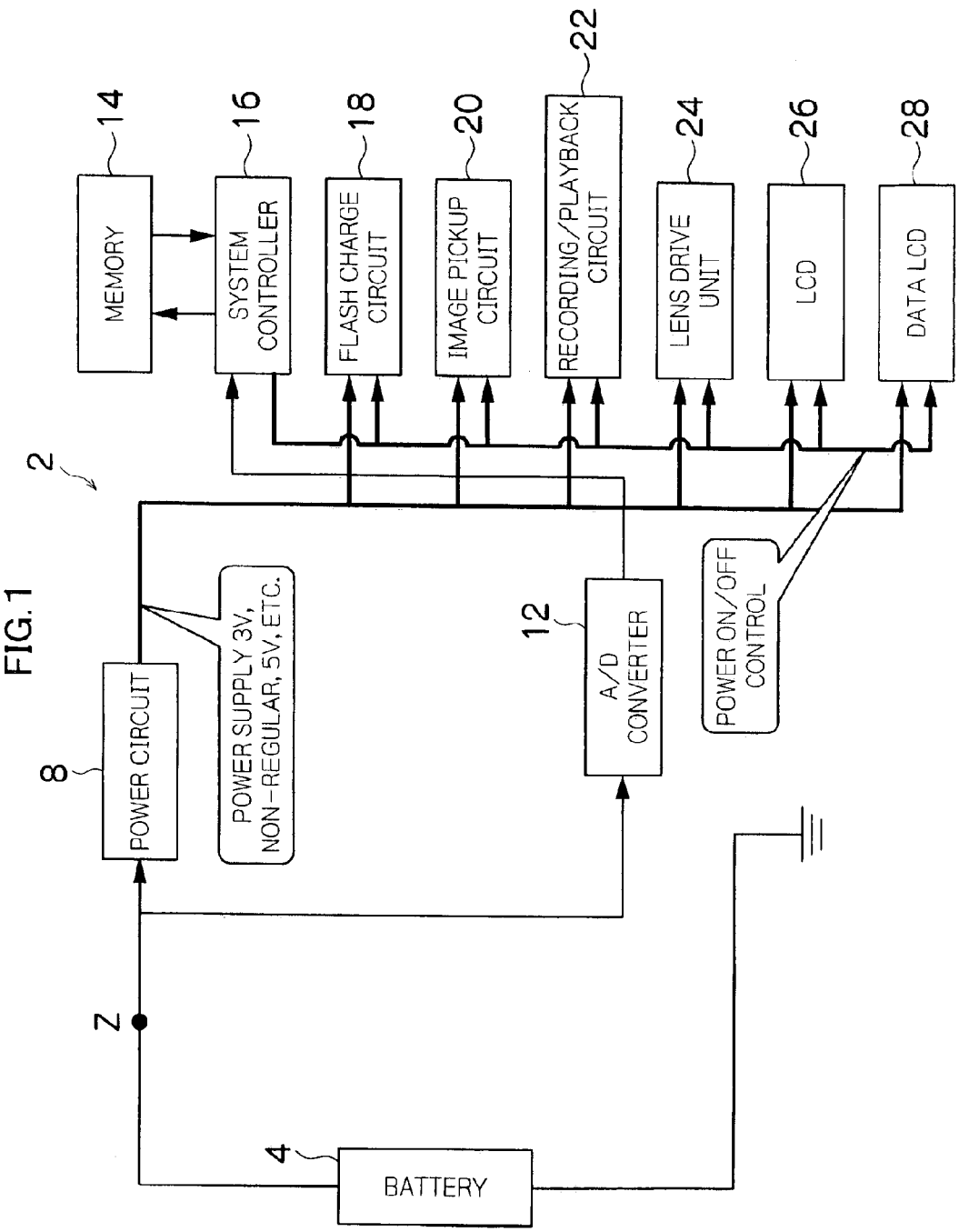
FIG. 1 is a block diagram showing a configuration of a digital camera.

FIG. 1 is a block diagram showing a configuration of a digital camera 2.

The digital camera 2 includes a flash charge circuit 18, an image pickup circuit 20, a recording/playback circuit 22, a lens drive unit 24, an LCD 26, a data LCD 28 and a system controller 16 that sends control signals to these circuits, etc. The system controller 16 exchanges data with a memory 14. A power circuit 8 is connected to the circuits 18 to 28 and power is supplied from the power circuit 8 to the circuits 18 to 28.

One end of a battery 4 is connected to the power circuit 8 and the other end is grounded. An A/D converter 12 is connected to the connection side of the battery 4 toward the power circuit 8 at a connection point Z and the A/D converter 12 is connected to the system controller 16. A voltage variation value at the connection point Z is input to the A/D converter 12 and the data of the A/D-converted voltage variation value is input to the system controller 16. The system controller 16 calculates a difference between a current value in an operating mode before a change which is stored in a memory 14 and a current value in an operating mode after the change which is stored in the memory 14, calculates a DC resistance value of the battery from the difference current value and input voltage variation value and sends a control signal to display an appropriate message concerning the remaining amount of the battery to the data LCD 28 when the DC resistance value becomes greater than a predetermined warning level.

Figure 2A:
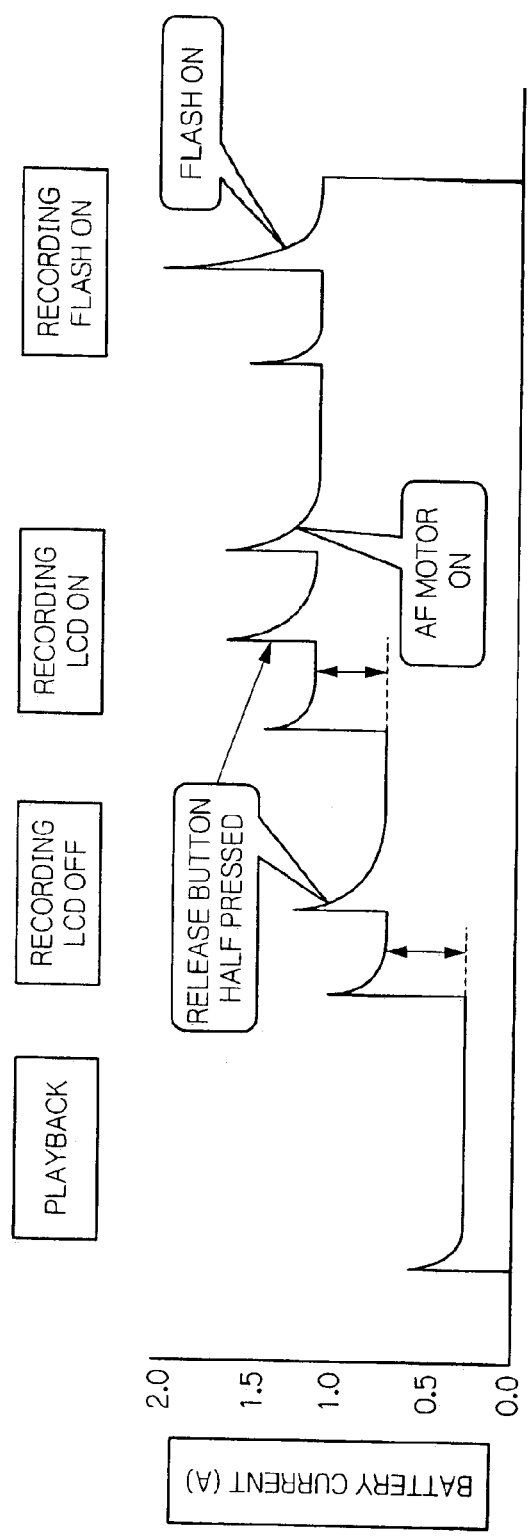
FIG. 2(a) illustrates how a battery current increases/decreases in each mode of the digital camera and FIG. 2(b) illustrates how a battery voltage corresponding to FIG. 2(a) increases/decreases in each mode of the digital camera.
Figure 2B:
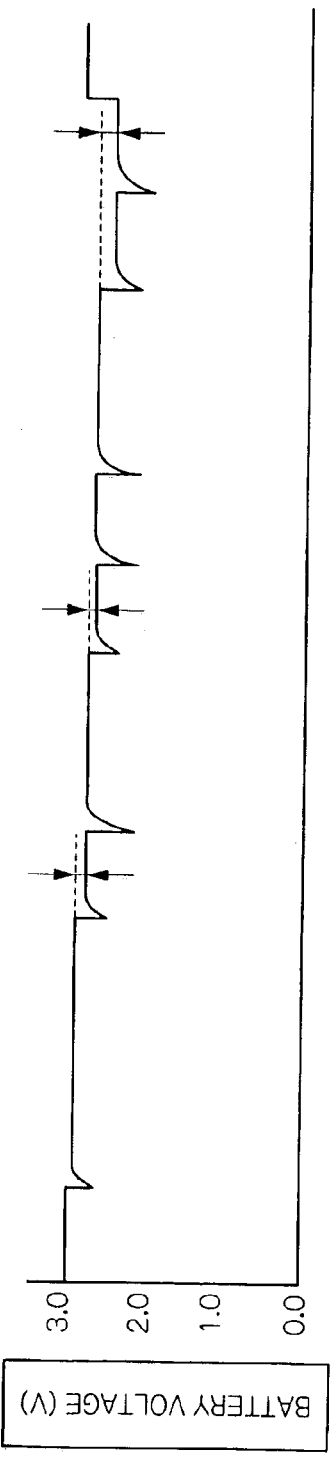

FIG. 2(a) illustrates how a battery current increases/decreases in each mode of the digital camera 2 and FIG. 2(b) illustrates how a battery voltage corresponding to FIG. 2(a) increases/decreases in each mode of the digital camera 2. Both FIG. 2(a) and FIG. 2(b) illustrate a playback mode, a recording mode with the LCD turned OFF, a recording mode with the LCD turned ON and a flash recoding mode.

When the system controller 16 is started and the digital camera is in the playback mode, the battery current increases instantaneously and then stabilizes to 0.3 A. This 0.3 A is stored in the memory 14. The battery voltage which is initially 3.0 V drops instantaneously to 2.6 V in response to the change of the current value and then drastically rises and reaches 2.9 V during a playback.

The circuit operating range of this digital camera 2 is 2.5 V or higher.

When the playback mode is changed for the recording mode with the LCD turned OFF, the battery current becomes 0.7 A. This 0.7 A is stored in the memory 14. The battery voltage becomes 2.8 V in response to the change of the current value. The system controller 16 calculates a difference (that is, 0.4 A) between the current value (0.3 A) in the playback mode stored in the memory 14 and the current value (0.7 A) in the LCD-OFF recording mode stored in the memory 14 and calculates a DC resistance value (that is, 0.25Ω) from the difference current value (0.4 A) and input voltage variation value (2.9 V–2.8 V=0.1 V).

Then, when the LCD-OFF recording mode is changed for the recording mode with the LCD turned ON, the battery current becomes 1.1 A. This 1.1 A is stored in the memory 14. The battery voltage becomes 2.7 V in response to the change of the current value. The system controller 16 calculates a difference (that is 0.4 A) between the current value (0.7 A) in the LCD-OFF recording mode stored in the memory 14 and the current value (1.1 A) in the LCD-ON recording mode stored in the memory 14 and calculates the DC resistance value (that is, 0.25Ω) of the battery from the difference current value (0.4 A) and input voltage variation (2.8 V–2.7 V=0.1 V).

Likewise when the LCD-ON recording mode is changed for the recording mode with the flash turned ON, the system controller 16 calculates the DC resistance value.

When the DC resistance value becomes a predetermined value or above, the system controller 16 sends an instruction signal for displaying a warning to the data LCD 28 and the data LCD 28 displays a warning about the battery remaining amount.

Figure 3:
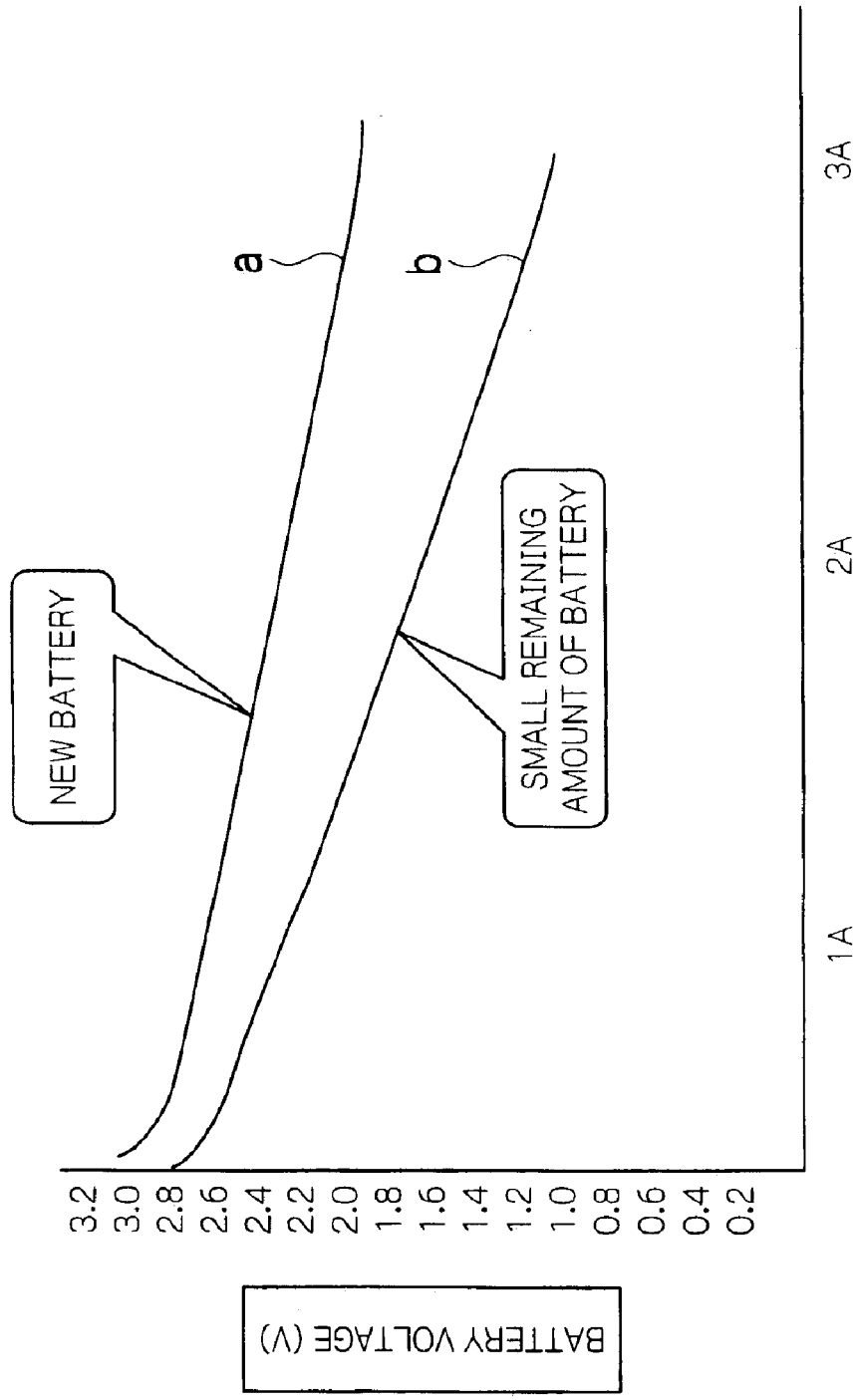
FIG. 3 illustrates variations in battery voltages according to the currents of a new battery a and a battery b with a small remaining amount.

FIG. 3 illustrates variations in battery voltages according to the currents of a new battery a and a battery b with a small remaining amount. The rate of decrease of the battery voltage of the battery with a small remaining amount becomes more notable as the current value increases.

Figure 4:
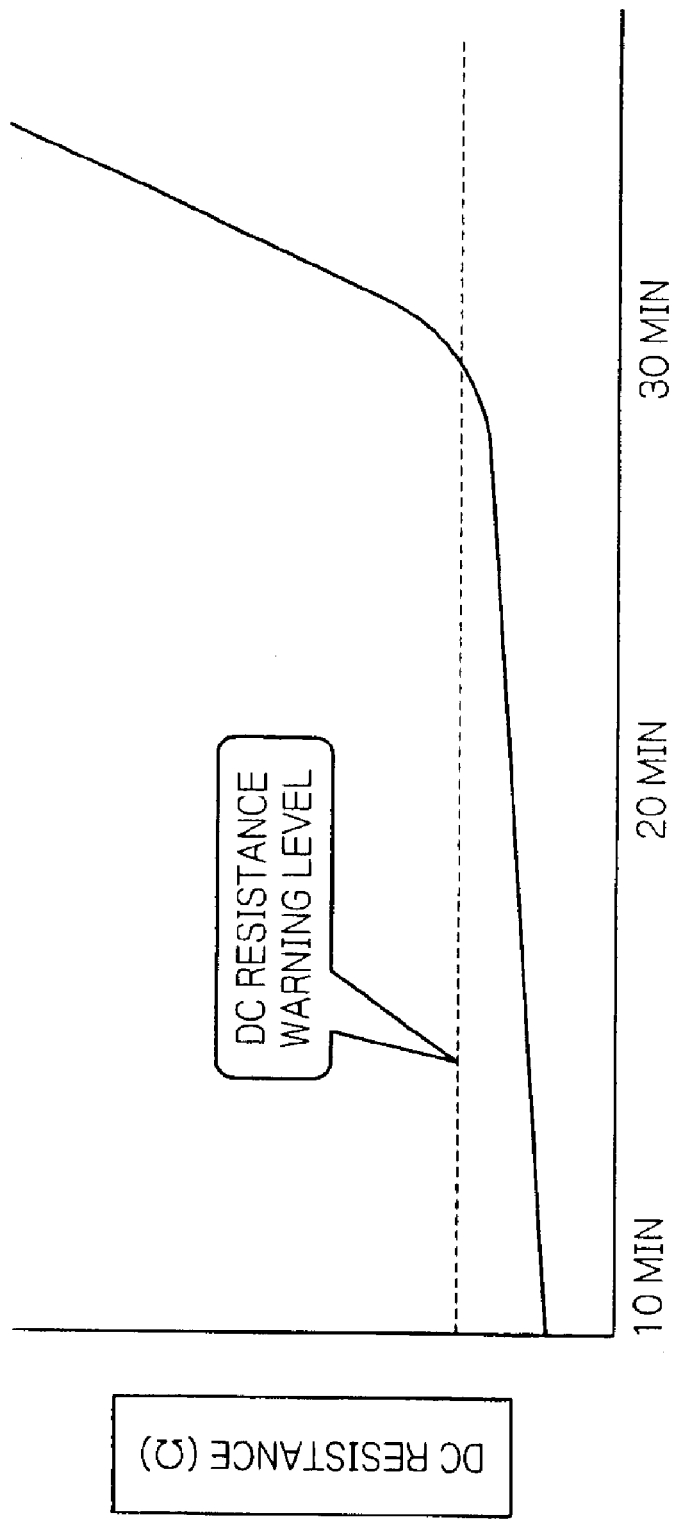
FIG. 4 is a graph showing how internal resistance of the battery increases with time.

FIG. 4 is a graph showing how the DC resistance of the battery 4 increases with time. The DC resistance value increases gradually and exceeds a warning level after approximately 30 minutes.

Since this embodiment allows a sufficient amount of battery power to be used before a warning about the battery remaining amount is issued, there will be no such case that several tens of images can still be taken after a warning about the remaining amount of the battery is issued. This embodiment does not use any dummy-load circuit and therefore consumes less power.

Figure 5:
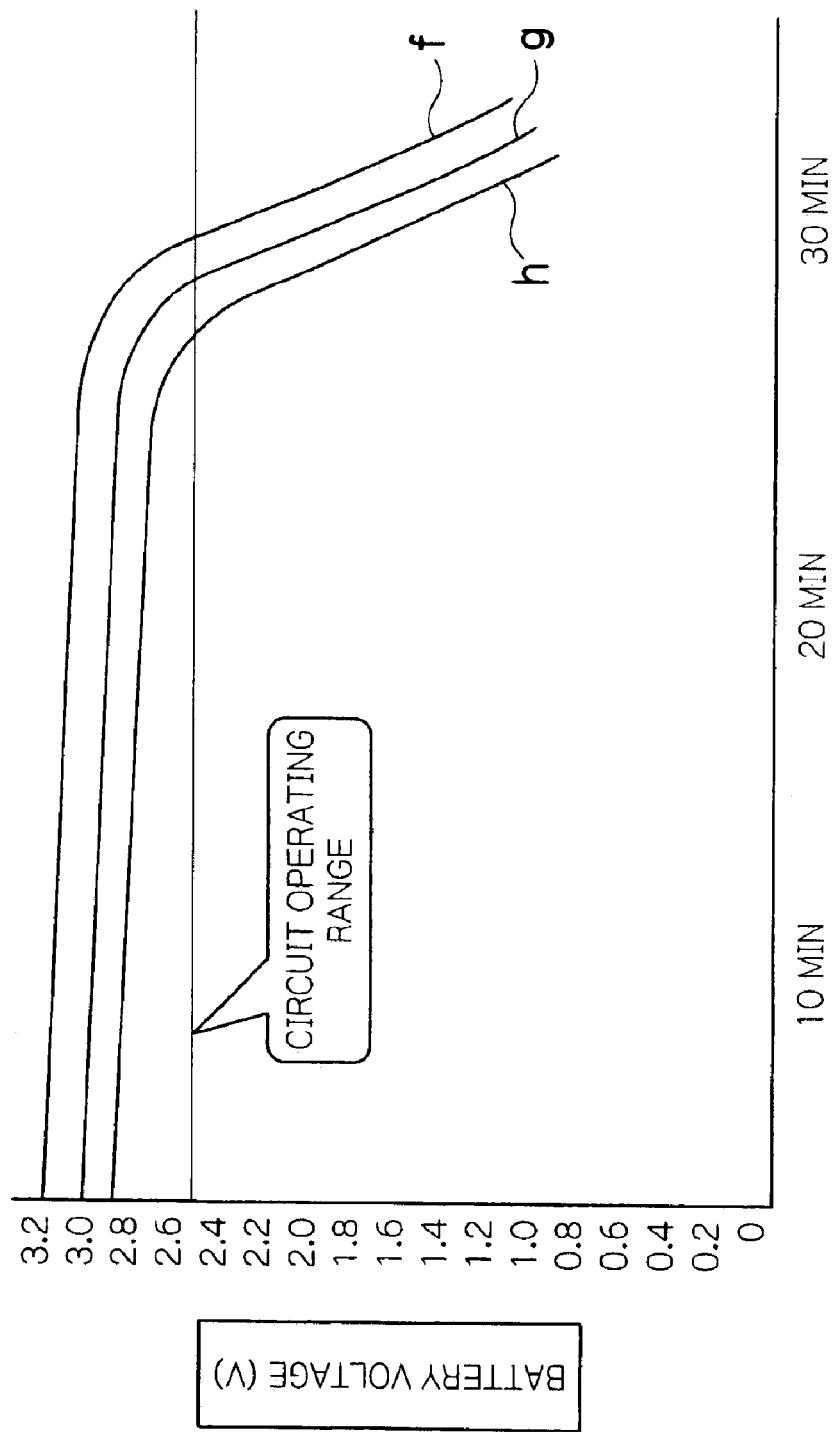
FIG. 5 is a graph showing variations in voltage values of various batteries.

FIG. 5 is a graph showing variations in voltage values of various batteries. The voltage characteristic changes depending on the battery. Here, three types f, g and h are shown. In all three cases, the voltage drops gradually with time and starts to drop drastically after approximately 30 minutes. In all three cases, the DC resistance value increases as the voltage drop increases, and therefore calculating the DC resistance value using the method of this embodiment can predict the remaining amount of the battery of any characteristic accurately.

According to the present invention, the battery remaining amount warning circuit can issue a warning about the remaining amount of the battery after fully using battery power and reduce current consumption, and therefore it is possible to know the life of a variety of types of battery.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A battery remaining amount warning circuit that detects a voltage drop of a battery in an electronic device, comprising:
    a storage device which stores a current value in each of a plurality of operating modes of the electronic device;
    a measuring device which measures a voltage variation of the battery when a first one of the operating modes of the electronic device is changed for a second one of the operating modes of the electronic device;
    a calculation device which calculates a DC resistance value of the battery from the voltage variation measured by the measuring device and a difference between the current value in the first operating mode stored in the storage device and the current value in the second operating mode stored in the storage device; and
    a warning device which gives a warning when the DC resistance value calculated by the calculation device becomes greater than a predetermined warning level.

2. The battery remaining amount warning circuit according to claim 1, wherein the electronic device is a digital camera and the plurality of operating modes include a playback mode, recording mode, flash charge recording mode, of the digital camera.

* * * * *